US012249502B2

(12) United States Patent
Nonomura et al.

(10) Patent No.: US 12,249,502 B2
(45) Date of Patent: Mar. 11, 2025

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Kazuki Nonomura, Toyama (JP); Kenichi Suzaki, Toyama (JP); Yoshimasa Nagatomi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 368 days.

(21) Appl. No.: 17/474,693

(22) Filed: Sep. 14, 2021

(65) Prior Publication Data
US 2022/0093386 A1 Mar. 24, 2022

(30) Foreign Application Priority Data

Sep. 24, 2020 (JP) .................................. 2020-160111

(51) Int. Cl.
*H01L 21/02* (2006.01)
*C23C 16/455* (2006.01)

(52) U.S. Cl.
CPC .... *H01L 21/0223* (2013.01); *C23C 16/45527* (2013.01); *H01L 21/02255* (2013.01)

(58) Field of Classification Search
CPC ........... H01L 21/0223; H01L 21/02255; H01L 21/02178; H01L 21/02181;
(Continued)

(56) References Cited

U.S. PATENT DOCUMENTS

| 2008/0050884 A1 | 2/2008 | Kenichi et al. |
| 2010/0009079 A1 | 1/2010 | Yamazaki et al. |
| 2016/0093542 A1 | 3/2016 | Masayuki et al. |
| 2018/0033618 A1* | 2/2018 | Ogawa .................. C23C 16/402 |
| 2020/0144082 A1 | 5/2020 | Kaga et al. |

FOREIGN PATENT DOCUMENTS

| JP | 09-092623 A | 4/1997 |
| JP | 2008-53326 A | 3/2008 |

(Continued)

OTHER PUBLICATIONS

Japanese Office Action issued on Jul. 27, 2022 for Japanese Patent Application No. 2020-160111.

(Continued)

*Primary Examiner* — Michael G Miller
(74) *Attorney, Agent, or Firm* — Volpe Koenig

(57) ABSTRACT

According to one aspect thereof, there is provided a method of manufacturing a semiconductor device, including: forming an oxide film containing a predetermined element on a surface of a substrate provided with a pattern formed thereon by repeatedly performing a cycle including: (a) forming a first layer containing the predetermined element by supplying a source gas containing the predetermined element from an outer periphery of the substrate toward the surface; and (b) forming an oxide layer containing the predetermined element by supplying an oxidizing gas from the outer periphery toward the surface, wherein (a) and (b) are performed non-simultaneously. A supply time of the oxidizing gas is selected such that a thickness distribution of the oxide film becomes a predetermined distribution.

19 Claims, 8 Drawing Sheets

(58) Field of Classification Search
CPC ......... H01L 21/02189; H01L 21/02205; H01L 21/0228; H01L 21/02104; H01L 21/67253; C23C 16/45527; C23C 16/403; C23C 16/40; C23C 16/06; C23C 16/12; C23C 16/14; C23C 16/24; C23C 16/401; C23C 16/405; C23C 16/455; C23C 16/52; C23C 16/045; C23C 16/45504
See application file for complete search history.

(56) References Cited

FOREIGN PATENT DOCUMENTS

| | | |
|---|---|---|
| JP | 2016-069660 A | 5/2016 |
| JP | 2018-026513 A | 2/2018 |
| KR | 10-2018-0032912 A | 4/2018 |
| WO | 2017/168675 A1 | 10/2017 |
| WO | 2020/066800 A1 | 4/2020 |

OTHER PUBLICATIONS

Korean Office Action issued on Jul. 28, 2023 for Korean Patent Application No. 10-2021-0120076.
State Intellectual Property Office of the People's Republic of China Notice of First Examination Issued on Sep. 14, 2023 for Chinese Patent Application No. 202111096352.8.
Singapore Search Report and Written Opinion issued on Oct. 18, 2022 for Singapore Patent Application No. 10202109907R.
Taiwan Examination Report issued on Oct. 6, 2022 for Taiwan Patent Application No. 110132956.

* cited by examiner

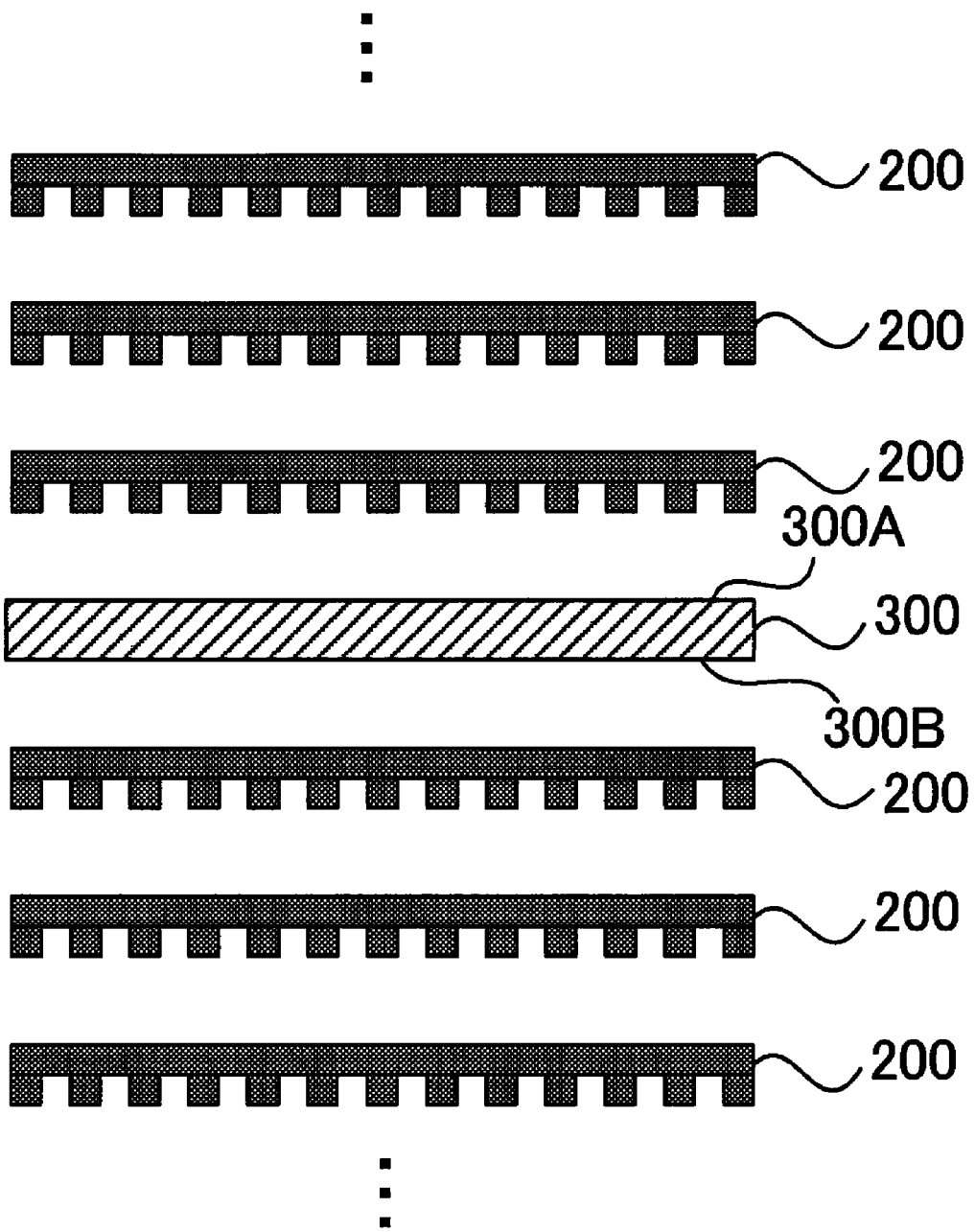

ary flow of a film-forming process according to the
METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2020-160111, filed on Sep. 24, 2020, in the Japanese Patent Office, the entire contents of which are hereby incorporated by reference.

BACKGROUND

1. Field

The present disclosure relates to a method of manufacturing a semiconductor device, a substrate processing apparatus, and a non-transitory computer-readable recording medium.

2. Related Art

A substrate retainer in which substrates, each of which is provided with a pattern formed on a surface thereof, are charged (or loaded) in a dispersed manner may be accommodated in a process chamber to form a predetermined film on the surface of the substrate.

When the predetermined film is formed on the surface of the substrate provided with the pattern formed on the surface thereof, since a surface area of the substrate may be increased due to the pattern on the surface of the substrate, a uniformity of a thickness of the film on the surface of the substrate may deteriorate.

SUMMARY

Described herein is a technique capable of controlling a thickness distribution of a film on a surface of a substrate when the film is formed on the surface of the substrate provided with a pattern formed on the surface thereof.

According to one aspect of the technique of the present disclosure, there is provided a method of manufacturing a semiconductor device, including: forming an oxide film containing a predetermined element on a surface of a substrate wherein the surface is provided with a pattern formed thereon by performing a cycle a predetermined number of times, the cycle including: (a) forming a first layer containing the predetermined element on the surface of the substrate by supplying a source gas containing the predetermined element to the substrate from an outer periphery of the substrate toward the surface of the substrate; and (b) forming an oxide layer containing the predetermined element on the surface of the substrate by supplying an oxidizing gas to the substrate from the outer periphery of the substrate toward the surface of the substrate to oxidize the first layer, wherein (a) and (b) are performed non-simultaneously, and a supply time of supplying the oxidizing gas to the substrate in (b) is selected such that a thickness distribution of the oxide film becomes a predetermined distribution on the surface of the substrate.

BRIEF DESCRIPTION OF THE DRAWINGS

FIG. 5 is a diagram for explaining an evaluation method used in examples of the embodiments described herein.

DETAILED DESCRIPTION

Embodiments

Figure 1:
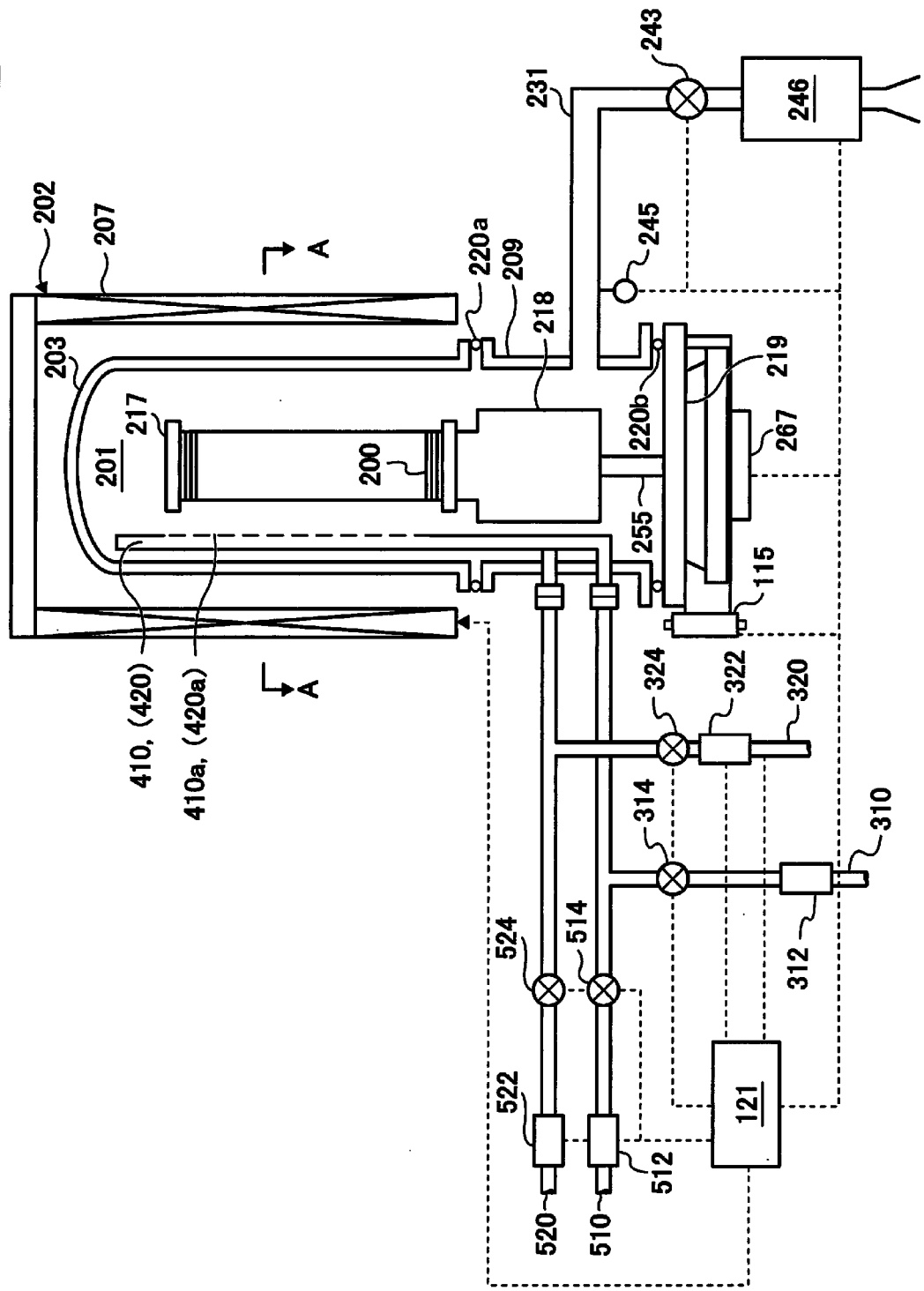
FIG. 1 is a diagram schematically illustrating a vertical cross-section of a substrate processing apparatus configured to form a film on a substrate according to one or more embodiments described herein.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

A substrate processing apparatus 10 according to a preferred embodiment includes a process furnace 202. The process furnace 202 includes a heater 207 serving as a heating apparatus (temperature regulator). The heater 207 is of a cylindrical shape, and is vertically installed while being supported by a heater base (not shown) serving as a support plate. The heater 207 is configured to heat an inside of a process chamber 201 described later at a predetermined temperature using the infrared ray.

A reaction tube 203 is provided in an inner side of the heater 207 to be aligned in a manner concentric with the heater 207. For example, the reaction tube 203 is made of a heat resistant material such as quartz ($SiO_2$). The reaction tube 203 is of a cylindrical shape with a closed upper end and an open lower end. A manifold (which is an inlet flange) 209 is provided under the reaction tube 203 to be aligned in a manner concentric with the reaction tube 203. The manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. As the manifold 209 is supported by the heater base (not shown), the reaction tube 203 is installed vertically. A process vessel (also referred to as a "reaction vessel") is constituted mainly by the reaction tube 203 and the manifold 209. The process chamber 201 is provided in a hollow cylindrical portion of the process vessel. The process chamber 201 is configured to accommodate a plurality of wafers including a wafer 200 serving as a substrate vertically in a horizontal orientation in a multistage manner by a boat 217 serving as a substrate retainer described later. In the present specification, the plurality of wafers including the wafer 200 may also be simply referred to as wafers 200. The heater 207 is provided so as to heat at least from one end (for example, a lower end) to the other end (for example, an upper end) of a wafer arrangement region in which the wafers 200 are arranged.

Nozzles 410 and 420 are provided in the process chamber 201 so as to penetrate a side wall of the manifold 209. Gas supply pipes 310 and 320 serving as gas supply lines are connected to the nozzles 410 and 420, respectively. As described above, the two nozzles 410 and 420 and the two gas supply pipes 310 and 320 are connected to the process vessel (the manifold 209), and it is possible to supply various gases into the process chamber 201 via the two nozzles 410 and 420 and the two gas supply pipes 310 and 320.

Mass flow controllers (also simply referred to as "MFCs") 312 and 322 serving as flow rate controllers (flow rate control structures) and valves 314 and 324 serving as opening/closing valves are sequentially installed at the gas supply pipes 310 and 320, respectively, from upstream sides to downstream sides of the gas supply pipes 310 and 320. Gas supply pipes 510 and 520 through which an inert gas is supplied are connected to the gas supply pipes 310 and 320 at downstream sides of the valves 314 and 324 of the gas supply pipes 310 and 320, respectively. MFCs 512 and 522 serving as flow rate controllers (flow rate control structures) and valves 514 and 524 serving as opening/closing valves are sequentially installed at the gas supply pipes 510 and 520, respectively, from upstream sides to downstream sides of the gas supply pipes 510 and 520.

Figure 2:
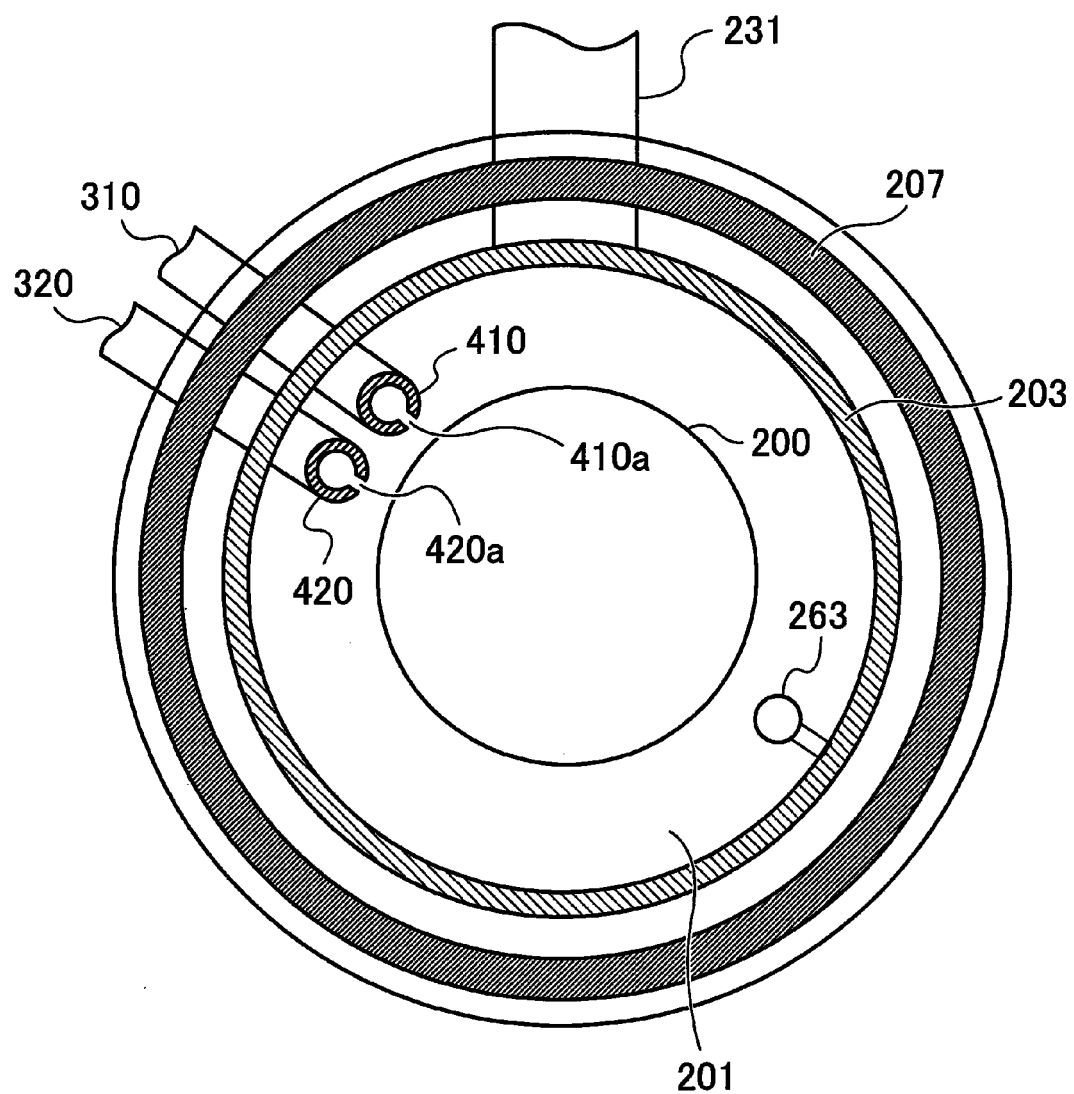
FIG. 2 is a diagram schematically illustrating a horizontal cross-section taken along the line A-A of the substrate processing apparatus shown in FIG. 1.

The nozzles 410 and 420 are connected to front ends of the gas supply pipes 310 and 320, respectively. As shown in FIG. 2, the nozzles 410 and 420 are installed in an annular space between an inner wall of the reaction tube 203 and the wafers 200 accommodated in the process chamber 201 when viewed from above, and extend from a lower portion of the inner wall of the reaction tube 203 to an upper portion of the inner wall of the reaction tube 203 along a stacking direction of the wafers 200, respectively. That is, the nozzles 410 and 420 are provided in a region that horizontally surrounds the wafer arrangement region where the wafers 200 are arranged along the stacking direction of the wafers 200. That is, the nozzles 410 and 420 are provided at edges (peripheral portions) of the wafers 200 accommodated in the process chamber 201, respectively. In other words, the nozzles 410 and 420 are provided perpendicularly to surfaces (flat surfaces) of the wafers 200, respectively. The nozzles 410 and 420 may include L-shaped nozzles, respectively. Horizontal portions of the nozzles 410 and 420 are installed through the side wall of the manifold 209. Vertical portions of the nozzles 410 and 420 extend from the lower end to the upper end of the wafer arrangement region.

A plurality of supply holes (which are first gas supply holes or source gas supply holes) 410a and a plurality of supply holes (which are second gas supply holes or oxidizing gas supply holes) 420a are provided at side surfaces of the nozzles 410 and 420 at positions facing the wafers 200 arranged in the wafer arrangement region, respectively. The plurality of supply holes 410a and the plurality of supply holes 420a may serve as gas supply ports, respectively. The plurality of supply holes 410a and the plurality of supply holes 420a are open toward a center of the reaction tube 203. The plurality of supply holes 410a and the plurality of supply holes 420a are configured such that gases such as the source gas and the oxidizing gas are supplied from outer peripheries (end portions) of the wafers 200 toward the surfaces of the wafers 200 accommodated in the process chamber 201 through the plurality of supply holes 410a and the plurality of supply holes 420a. The plurality of supply holes 410a and the plurality of supply holes 420a are provided in a region of the reaction tube 203 where the wafers 200 are arranged, that is, at positions facing the boat 217 described later. In other words, the plurality of supply holes 410a and the plurality of supply holes 420a are provided from a lower end of the heater 207 to an upper portion of the heater 207.

The plurality of supply holes 410a and the plurality of supply holes 420a are provided throughout a range from a lower portion to an upper portion of the reaction tube 203. An opening area of each of the gas supply holes 410a is the same, and an opening area of each of the gas supply holes 420a is the same. Each of the gas supply holes 410a is provided at the same pitch, and each of the gas supply holes 420a is provided at the same pitch. However, the plurality of supply holes 410a and the plurality of supply holes 420a are not limited thereto. For example, the opening area of each of the gas supply holes 410a and the opening area of each of the gas supply holes 420a may gradually increase from lower portions (upstream sides) toward upper portions (downstream sides) of the nozzles 410 and 420, respectively. In such a configuration, it is possible to further uniformize a flow rate of the gas supplied through the plurality of supply holes 410a or the plurality of supply holes 420a.

According to the present embodiment, gases such as the source gas and the oxidizing gas are supplied through the nozzles 410 and 420 provided in the vertical annular space (that is, a cylindrical space) defined by an inner surface of the side wall (that is, the inner wall) of the reaction tube 203 and the edges (peripheral portions) of the wafers 200 arranged in the reaction tube 203. Then, the gases are ejected into the reaction tube 203 in the vicinity of the wafers 200 through the plurality of supply holes 410a and the plurality of supply holes 420a of the nozzles 410 and 420, respectively. The gases ejected into the reaction tube 203 mainly flow parallel to the surfaces of the wafers 200, that is, in a horizontal direction. That is, the plurality of supply holes 410a and the plurality of supply holes 420a are provided to face the outer peripheries of the wafers 200, and configured such that the gases are supplied from the outer peripheries (end portions) of the wafers 200 toward the surfaces of the wafers 200 (for example, centers of the wafers 200) though the plurality of supply holes 410a and the plurality of supply holes 420a. The configuration of the plurality of supply holes 410a and the plurality of supply holes 420a described above may also be referred to as a "side flow configuration".

The source gas containing a predetermined element is supplied into the process chamber 201 through the gas supply pipe 310 provided with the MFC 312 and the valve 314 and the nozzle 410. When the source gas is supplied through the nozzle 410, the nozzle 410 may be referred to as a "source gas nozzle 410".

In the present specification, the term "source gas" may refer to a source material in a gaseous state under the normal temperature and the normal pressure (that is, the room temperature and the atmospheric pressure) or a gas obtained by vaporizing a source material in a liquid state (that is, a liquid source material) under the normal temperature and the normal pressure. In the present specification, the term "source material" may refer to "source material in the liquid state" alone, may refer to "source material (source gas) in the gaseous state" alone and may refer to both of "source material in the liquid state" and "source material in the gaseous state". Since an organic compound such as TMA, TEMAH and TEMAZ is a liquid source material, the organic compound gasified (or vaporized) by a component such as a vaporizer may be used as the source gas.

An oxygen-containing gas serving as the oxidizing gas (oxidizing agent) is supplied into the process chamber 201 through the gas supply pipe 320 provided with the WC 322 and the valve 324 and the nozzle 420.

The inert gas is supplied into the process chamber 201 through the gas supply pipes 510 and 520 provided with the MFCs 512 and 522 and the valves 514 and 524, respectively, the gas supply pipes 310 and 320 and the nozzles 410 and 420.

When the source gas is supplied through the gas supply pipe 310, a source gas supplier (which is a source gas supply system) is constituted mainly by the gas supply pipe 310, the MFC 312, the valve 314 and the nozzle 410. The source gas supplier may also be referred to as a "source supplier" or a "source supply system".

When the oxidizing gas is supplied through the gas supply pipe 320, an oxidizing gas supplier (which is an oxidizing gas supply system) is constituted mainly by the gas supply pipe 320, the MFC 322, the valve 324 and the nozzle 420.

An inert gas supplier (which is an inert gas supply system) is constituted mainly by the gas supply pipes 510 and 520, the MFCs 512 and 522 and the valves 514 and 524.

The source gas supplier and the oxidizing gas supplier may be collectively referred to as a gas supplier (which is a gas supply system). The gas supplier may further include the inert gas supplier.

An exhaust pipe 231 serving as an exhaust flow path through which an inner atmosphere of the process chamber 201 is exhausted is provided at the manifold 209. A vacuum pump 246 serving as a vacuum exhaust apparatus is connected to the exhaust pipe 231 through a pressure sensor 245 and an APC (Automatic Pressure Controller) valve 243. The pressure sensor 245 serves as a pressure detector (pressure detecting structure) to detect an inner pressure of the process chamber 201, and the APC valve 243 serves as an exhaust valve (pressure regulator). With the vacuum pump 246 in operation, the APC valve 243 may be opened or closed to vacuum-exhaust the process chamber 201 or stop the vacuum exhaust. With the vacuum pump 246 in operation, an opening degree of the APC valve 243 may be adjusted based on pressure information detected by the pressure sensor 245, in order to control (adjust) the inner pressure of the process chamber 201. An exhauster (which is an exhaust system) is constituted mainly by the exhaust pipe 231, the APC valve 243 and the pressure sensor 245. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS (stainless steel), and is of a disk shape. An O-ring 220b serving as a seal is provided on an upper surface of the seal cap 219 so as to be in contact with the lower end of the manifold 209. A rotator 267 configured to rotate the boat 217 described later is provided under the seal cap 219 opposite to the process chamber 201. A rotating shaft 255 of the rotator 267 penetrates the seal cap 219, and is connected to the boat 217. As the rotator 267 rotates the boat 217, the wafers 200 supported by the boat 217 are rotated. A boat elevator 115 serving as an elevator is vertically provided outside the reaction tube 203. The seal cap 219 may be elevated or lowered in the vertical direction by the boat elevator 115. When the seal cap 219 is elevated or lowered by the boat elevator 115, the boat 217 placed on the seal cap 219 may be transferred (loaded) into the process chamber 201 or transferred (unloaded) out of the process chamber 201. The boat elevator 115 serves as a transfer device (or a transport device) capable of loading the boat 217 (that is, the wafers 200 accommodated in the boat 217) into the process chamber 201 or unloading the boat 217 (that is, the wafers 200 accommodated in the boat 217) out of the process chamber 201. A shutter (not shown) serving as a furnace opening lid capable of airtightly sealing the lower end opening of the manifold 209 is provided under the manifold 209. The shutter (not shown) is configured to close the lower end opening of the manifold 209 when the seal cap 219 is lowered by the boat elevator 115. The shutter (not shown) is made of a metal such as SUS (stainless steel), and of a disk shape. An O-ring (not shown) serving as a seal is provided on an upper surface of the shutter (not shown) so as to be in contact with the lower end of the manifold 209. An opening/closing operation of the shutter (not shown) such as an elevation operation and a rotation operation is controlled by a shutter opener/closer (which is a shutter opening/closing structure, not shown).

The boat 217 serving as a substrate retainer (substrate support) is configured to align the wafers 200, for example, from 25 to 200 wafers in the vertical direction and configured to support the wafers 200 in a multistage manner, while the wafers 200 are horizontally oriented with their centers aligned with each other. That is, the boat 217 supports (accommodates) the wafers 200 in a multistage manner with a predetermined interval (which is a pitch) therebetween. The boat 217 is made of a heat resistant material such as quartz and SiC. Insulating plates (not shown) are provided under the boat 217 in a multistage manner. The insulating plates are made of a heat resistant material such as quartz and SiC. The insulating plates suppress the transmission of heat from the heater 207 to the seal cap 219. However, the present embodiment is not limited thereto. For example, instead of the insulating plates, a heat insulating cylinder 218 may be provided as a cylinder made of a heat resistant material such as quartz and SiC.

A temperature sensor 263 serving as a temperature detector is provided in the reaction tube 203. The state of electric conduction to the heater 207 is adjusted based on temperature information detected by the temperature sensor 263 such that a desired temperature distribution of the inner temperature of the process chamber 201 is obtained. Similar to the nozzles 410 and 420, the temperature sensor 263 is L-shaped and is provided along the inner wall of the reaction tube 203.

Figure 3:
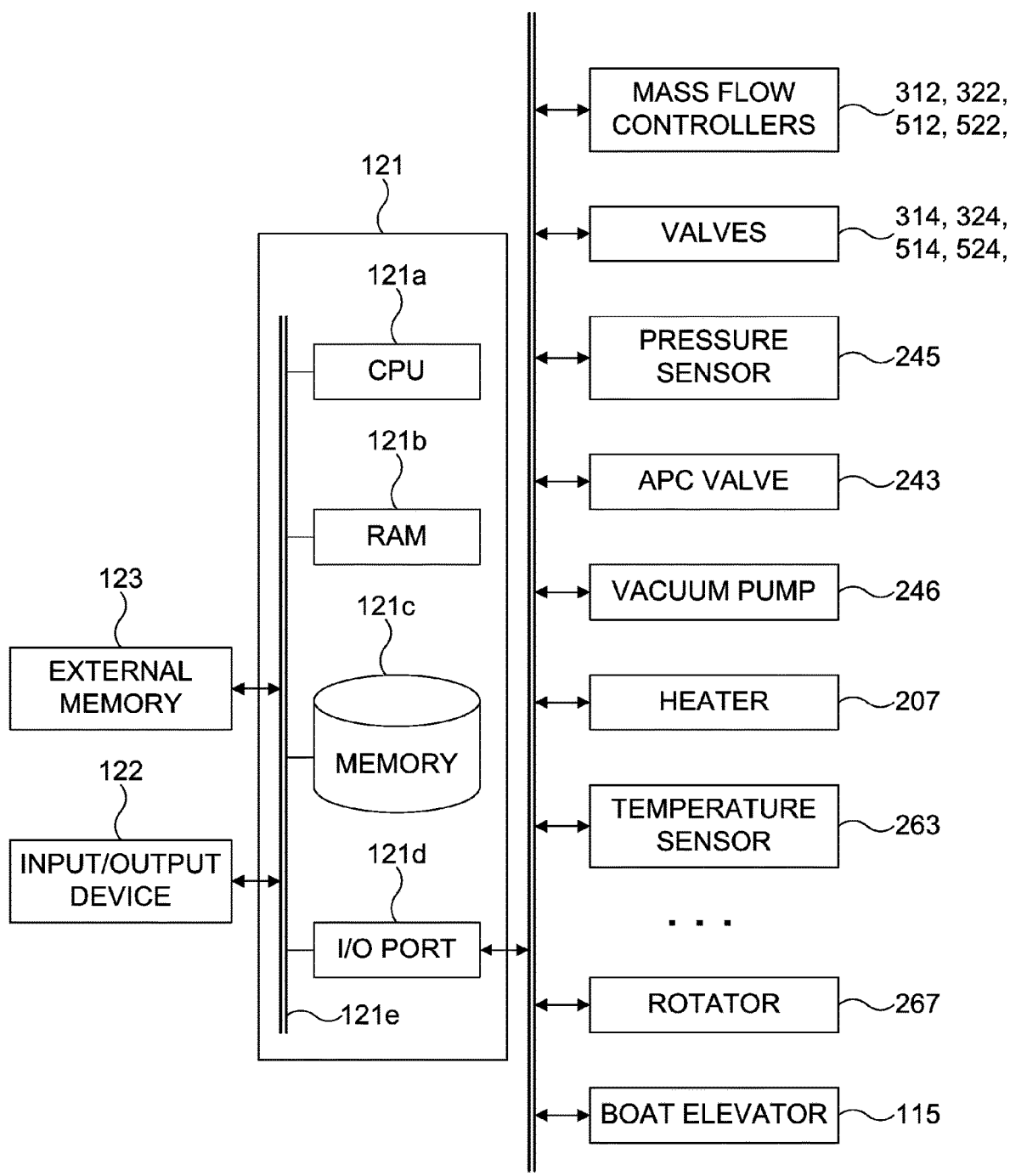
FIG. 3 is a block diagram schematically illustrating a configuration of a controller and related components of the substrate processing apparatus according to the embodiments described herein.

As shown in FIG. 3, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by a component such as a flash memory, a hard disk drive (HDD) and a solid state drive (SSD). For example, a control program configured to control the operation of the substrate processing apparatus 10 or a process recipe containing information on processing sequences and processing conditions of a substrate processing such as a film-forming process described later may be readably stored in the memory 121c. The process recipe is obtained by combining steps of the film-forming process described later such that the controller 121 can execute the steps to acquire a predetermine result, and functions as a program. Hereafter, the process recipe and the control program may be collectively or individually referred to as a "program". In addition, the process recipe may also be simply referred to as a "recipe". In the present specification, the term "program" may refer to the process recipe alone, may refer to the control program alone, or may refer to both of the process recipe and the control program. The RAM 121b functions as a memory area (work area) where a program or data read by the CPU 121a is temporarily stored.

The I/O port 121d is connected to the above-described components such as the mass flow controllers (MFCs) 512, 522, 312 and 322, the valves 514, 524, 314 and 324, the pressure sensor 245, the APC valve 243, the vacuum pump 246, the temperature sensor 263, the heater 207, the rotator 267, the boat elevator 115 and the shutter opener/closer (not shown).

The CPU 121a is configured to read the control program from the memory 121c and execute the read control program. In addition, the CPU 121a is configured to read the recipe from the memory 121c in accordance with an operation command inputted from the input/output device 122. According to the contents of the read recipe, the CPU 121a may be configured to control various operations such as flow rate adjusting operations for various gases by the MFCs 512, 522, 312 and 322, opening/closing operations of the valves 514, 524, 314 and 324, an opening/closing operation of the APC valve 243, a pressure adjusting operation by the APC valve 243 based on the pressure sensor 245, a start and stop of the vacuum pump 246, a temperature adjusting operation of the heater 207 based on the temperature sensor 263, an operation of adjusting rotation and rotation speed of the boat 217 by the rotator 267, an elevating and lowering operation of the boat 217 by the boat elevator 115 and an opening/closing operation of the shutter (not shown) by the shutter opener/closer (not shown).

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and the SSD. The memory 121c or the external memory 123 may be embodied by a non-transitory computer readable recording medium. Hereafter, the memory 121c and the external memory 123 may be collectively or individually referred to as a recording medium. In the present specification, the term "recording medium" may refer to the memory 121c alone, may refer to the external memory 123 alone, or may refer to both of the memory 121c and the external memory 123. Instead of the external memory 123, a communication means such as the Internet and a dedicated line may be used for providing the program to the computer.

(2) Substrate Processing

Hereinafter, an exemplary sequence of the substrate processing (that is, the film-forming process) of forming a film (oxide film) on the wafer 200 provided with a pattern formed on the surface thereof, which is a part of manufacturing processes of a semiconductor device by using the substrate processing apparatus 10 described above, will be described with reference to FIG. 4. Hereinafter, operations of components constituting the substrate processing apparatus 10 are controlled by the controller 121.

According to the present embodiment, for example, a large surface area substrate may be used as the wafer 200. The large surface area substrate is provided with the pattern formed on a surface such as an upper surface thereof such that a surface area of the upper surface of the substrate is ½ times or more, preferably 10 times or more, and more preferably 50 times or more as large as a surface area of an upper surface of a bare wafer on which no pattern is formed. That is, when the wafer 200 is of a circular shape, for example, a surface area of an upper surface of the wafer 200 on which the pattern is formed may be equal to or greater than $3\pi r^2$ with respect to a radius "r" of the wafer 200.

According to the present embodiment, for example, by performing a cycle a predetermined number of times (n times), an oxide film containing a predetermined element (hereinafter, also simply referred to as an "oxide film") is formed on the wafer 200. For example, the cycle may include: a step of supplying a gas containing the predetermined element serving as the source gas into the process chamber 201 through the plurality of supply holes 410a opened at the nozzle 410 while heating the process chamber 201 by the heater 207 at a predetermined temperature; and a step of supplying the oxidizing gas into the process chamber 201 through the plurality of supply holes 420a opened at the nozzle 420. The wafers 200 are accommodated in the process chamber 201 while supported by (stacked in) the boat 217, and the steps in the cycle are performed non-simultaneously.

In the present specification, the term "wafer" may refer to "a wafer itself" or may refer to "a wafer and a stacked structure (aggregated structure) of a predetermined layer (or layers) or a film (or films) formed on a surface of a wafer". In the present specification, the term "a surface of a wafer" may refer to "a surface of a wafer itself" or may refer to "a surface of a predetermined layer or a film formed on a wafer". Thus, in the present specification, "forming a predetermined layer (or film) on a wafer" may refer to "forming a predetermined layer (or film) on a surface of a wafer itself" or may refer to "forming a predetermined layer (or film) on a surface of another layer or another film formed on a wafer". In the present specification, the terms "substrate"

and "wafer" may be used as substantially the same meaning. That is, the term "substrate" may be substituted by "wafer" and vice versa.

<Wafer Charging Step S101 and Boat Loading Step S102>

The wafers 200 are charged (transferred) into the boat 217 (wafer charging step S101). After the boat 217 is charged with the wafers 200, the shutter (not shown) is moved by the shutter opener/closer (not shown) to open the lower end opening of the manifold 209 (shutter opening step). Then, as shown in FIG. 1, the boat 217 charged with the wafers 200 is elevated by the boat elevator 115 and loaded (transferred) into the process chamber 201 (boat loading step S102). With the boat 217 loaded, the seal cap 219 seals the lower end opening of the manifold 209 via the O-ring 220b.

<Pressure and Temperature Adjusting Step S103>

The vacuum pump 246 vacuum-exhausts the inner atmosphere of the process chamber 201 such that the inner pressure of the process chamber 201 in which the wafers 200 are accommodated reaches and is maintained at a desired pressure (vacuum degree). In the pressure and temperature adjusting step S103, the inner pressure of the process chamber 201 is measured by the pressure sensor 245, and the APC valve 243 is feedback-controlled based on the pressure information measured by the pressure sensor 245 (pressure adjusting step). The vacuum pump 246 continuously vacuum-exhausts the inner atmosphere of the process chamber 201 until at least the processing of the wafer 200 is completed. The heater 207 heats the process chamber 201 such that the inner temperature of the process chamber 201 reaches and is maintained at a desired temperature. The amount of the electric conduction to the heater 207 is feedback-controlled based on the temperature information detected by the temperature sensor 263 such that a desired temperature distribution of the inner temperature of the process chamber 201 is obtained (temperature adjusting step). The heater 207 continuously heats the process chamber 201 until at least the processing of the wafer 200 is completed. Then, the rotator 267 rotates the wafers 200 by rotating the boat 217. The rotator 267 continuously rotates the boat 217 (that is, the wafers 200) until at least the processing of the wafer 200 is completed.

<Film-Forming Step S110>

Thereafter, the film-forming step S110 is performed by performing a cycle including a source gas supply step S111, a residual gas removing step S112, an oxidizing gas supply step S113 and a residual gas removing step S114 sequentially a predetermined number of times. The steps in the cycle are performed non-simultaneously.

<Source Gas Supply Step S111>

The valve 314 is opened to supply the source gas into the gas supply pipe 310. After a flow rate of the source gas is adjusted by the MFC 312, the source gas whose flow rate is adjusted is supplied onto the wafers 200 through the plurality of supply holes 410a opened at the nozzle 410. That is, the wafers 200 are exposed to the source gas. The source gas supplied through the plurality of supply holes 410a passes through the inside of the process chamber 201, and is exhausted through the exhaust pipe 231. In the source gas supply step S111, simultaneously, the valve 514 may be opened to supply the inert gas serving as a carrier gas into the gas supply pipe 510. After a flow rate of the inert gas is adjusted by the MFC 512, the inert gas whose flow rate is adjusted is supplied into the process chamber 201 with the source gas through the plurality of supply holes 410a of the nozzle 410, and is exhausted through the exhaust pipe 231.

As the inert gas, for example, a rare gas such as nitrogen ($N_2$) gas, argon (Ar) gas, helium (He) gas, neon (Ne) gas and xenon (Xe) gas may be used. For example, one or more of the gases described above may be used as the inert gas. The same also applies to each step described later.

In the source gas supply step S111, in order to prevent the source gas from entering the nozzle 420 (that is, in order to prevent a back flow of the source gas), the valve 524 may be opened to supply the inert gas into the gas supply pipe 520. The inert gas supplied into the gas supply pipe 520 is then supplied into the process chamber 201 through the nozzle 420 (that is, the process chamber 201 is purged), and is exhausted through the exhaust pipe 231.

In the source gas supply step S111, the APC valve 243 is appropriately adjusted (controlled) to adjust the inner pressure of the process chamber 201 to a predetermined pressure. For example, the predetermined pressure of the process chamber 201 in the source gas supply step S111 may range from 1 Pa to 1,000 Pa, preferably from 1 Pa to 100 Pa, and more preferably from 10 Pa to 50 Pa. In the present specification, for example, a numerical range represented by "from 1 Pa to 1,000 Pa" refers to a range equal to or more than 1 Pa and equal to or less than 1,000 Pa. That is, the numerical range "from 1 Pa to 1,000 Pa" includes 1 Pa as a lower limit and 1,000 Pa as an upper limit. The same also applies to all numerical ranges of parameters described herein such as a pressure, a flow rate, an amount of time and a temperature. In the source gas supply step S111, for example, a supply flow rate of the source gas adjusted by the MFC 312 may be set to a predetermined flow rate ranging from 10 sccm to 2,000 sccm, preferably from 50 sccm to 1,000 sccm, and more preferably from 100 sccm to 500 sccm. For example, a supply flow rate of the inert gas adjusted by the MFC 512 may be set to a predetermined flow rate ranging from 1 slm to 30 slm, preferably from 1 slm to 20 slm, and more preferably from 1 slm to 10 slm. For example, a supply time of supplying the source gas to the wafer 200 may be set to a predetermined amount of time ranging from 1 second to 60 seconds, preferably from 1 second to 20 seconds, and more preferably from 2 seconds to 15 seconds.

For example, the heater 207 heats the process chamber 201 such that a temperature of the wafer 200 reaches and is maintained at a predetermined temperature ranging from the room temperature to 450° C., preferably from 350° C. to 420° C. When the temperature of the wafer 200 is lower than 350° C., a practical oxidation rate by the oxidizing gas may not be obtained, and when the temperature of the wafer 200 is equal to or higher than 420° C., a step coverage of the film-forming process may decrease for reasons such as a thermal decomposition of the source gas. By setting the temperature of the wafer 200 to 350° C. or higher and 420° C. or lower, the practical oxidation rate may be easily obtained while maintaining the step coverage. However, the higher the temperature of the wafer 200, the higher a deactivation rate of the oxidizing gas (particularly, $O_3$ gas)) used in the oxidizing gas supply step S113 described later. Therefore, it is preferable that the temperature of the wafer 200 is equal to or lower than 450° C.

For example, by supplying the source gas such as a gas containing aluminum (Al) as the predetermined element into the process chamber 201 according to the above-described processing conditions, an aluminum-containing layer serving as a first layer is formed on a top surface (outermost surface) of the wafer 200. The aluminum-containing layer may contain carbon (C) and hydrogen (H) contained in the source gas in addition to aluminum (Al). The aluminum-containing layer may be formed by a physical adsorption of the source gas on the top surface of the wafer 200, by a chemical adsorption of substances generated by decomposing a part of the source gas on the top surface of the wafer 200, or by a deposition of aluminum generated by a thermal decomposition of the source gas on the top surface of the wafer 200. That is, the aluminum-containing layer may be an adsorption layer (a physical adsorption layer or a chemical adsorption layer) of the source gas or substances generated by decomposing a part of the source gas, or may be an aluminum deposition layer (an aluminum layer).

For example, an organic-based aluminum-containing gas such as trimethyl aluminum ($(CH_3)_3Al$, TMA) gas serving as the gas containing aluminum may be used as the source gas. In addition, a halogen-based aluminum-containing gas such as aluminum chloride ($AlCl_3$) gas may be used as the gas containing aluminum. For example, a gas containing a metal element other than aluminum as the predetermined element may be used as the source gas. For example, a gas containing hafnium (Hf) may be used as the source gas. For example, an organic-based hafnium-containing gas such as tetrakis ethylmethyl amino hafnium ($((CH_3)(C_2H_5)N]_4Hf$, TEMAH) gas or a halogen-based hafnium-containing gas such as hafnium chloride ($HfCl_4$) gas may be used as the gas containing hafnium. For example, a gas containing zirconium (Zr) may be used as the source gas. For example, an organic-based zirconium-containing gas such as tetrakis ethylmethylamino zirconium ($(NCH_3C_2H_5)_4Zr$, TEMAZ) or a halogen-based zirconium-containing gas such as zirconium chloride ($ZrCl_4$) gas may be used as the gas containing zirconium. In addition, a gas containing a metal element such as titanium (Ti), tantalum (Ta), molybdenum (Mo) and tungsten (W) or a semiconductor element such as silicon (Si) as the predetermined element may be used as the source gas.

<Residual Gas Removing Step S112>

After the aluminum-containing layer is formed, the valve 314 is closed to stop the supply of the source gas. In the residual gas removing step S112, with the APC valve 243 open, the vacuum pump 246 vacuum-exhausts the inner atmosphere of the process chamber 201 to remove a residual source gas in the process chamber 201 which did not react or which contributed to the formation of the aluminum-containing layer from the process chamber 201. In the residual gas removing step S112, with the valves 514 and 524 open, the inert gas is continuously supplied into the process chamber 201. The inert gas serves as a purge gas, which improves the efficiency of removing the residual source gas which did not react or which contributed to the formation of the aluminum-containing layer from the process chamber 201. In the residual gas removing step S112, the inert gas supplied through the valves 514 and 524 may be continuously supplied or may be intermittently (that is, in a pulse-wise manner) supplied.

<Oxidizing Gas Supply Step S113>

After the residual gas such as the residual source gas in the process chamber 201 is removed from the process chamber 201, the valve 324 is opened to supply the oxygen-containing gas serving as the oxidizing gas (reactive gas) into the gas supply pipe 320. After a flow rate of the oxidizing gas is adjusted by the MFC 322, the oxidizing gas whose flow rate is adjusted is supplied onto the wafers 200 accommodated in the process chamber 201 through the plurality of supply holes 420a of the nozzle 420, and is exhausted through the exhaust pipe 231. That is, the wafers 200 are exposed to the oxidizing gas. In the oxidizing gas supply step S113, the valve 524 may be opened to supply the inert gas into the gas supply pipe 520. After a flow rate of the inert gas is adjusted by the MFC 522, the inert gas whose flow rate is adjusted is supplied into the process chamber 201 with the oxidizing gas, and is exhausted through the exhaust pipe 231. In the oxidizing gas supply step S113, in order to prevent the oxidizing gas from entering the nozzle 410 (that is, in order to prevent a back flow of the oxidizing gas), the valve 514 may be opened to supply the inert gas into the gas supply pipe 510. The inert gas supplied into the gas supply pipe 510 is then supplied into the process chamber 201 through the nozzle 410 (that is, the process chamber 201 is purged), and is exhausted through the exhaust pipe 231.

In the oxidizing gas supply step S113, the APC valve 243 is appropriately adjusted (controlled) to adjust the inner pressure of the process chamber 201 to a predetermined pressure. For example, the predetermined pressure of the process chamber 201 in the oxidizing gas supply step S113 may range from 1 Pa to 1,000 Pa, preferably from 1 Pa to 100 Pa, and more preferably from 10 Pa to 40 Pa. In the oxidizing gas supply step S113, for example, a supply flow rate of the oxidizing gas adjusted by the MFC 322 may be set to a predetermined flow rate ranging from 5 slm to 40 slm, preferably from 5 slm to 30 slm, and more preferably from 10 slm to 20 slm. The other process conditions of the oxidizing gas supply step S113 are substantially the same as those of the source gas supply step S111 described above.

For example, as the oxidizing gas, an oxygen-containing gas such as oxygen ($O_2$) gas, ozone ($O_3$) gas, plasma-excited $O_2$ ($O_2$*) gas, a mixed gas of the $O_2$ gas and hydrogen ($H_2$) gas, water vapor ($H_2O$ gas), hydrogen peroxide ($H_2O_2$) gas, nitrogen peroxide ($N_2O$) gas, nitrogen monoxide (NO) gas, nitrogen dioxide ($NO_2$) gas, carbon monoxide (CO) gas and carbon dioxide ($CO_2$) gas may be used. In addition, one or more of the gases described above may be used as the oxidizing gas.

In the oxidizing gas supply step S113, the oxidizing gas and the inert gas are supplied into the process chamber 201 without any other gas being supplied into the process chamber 201 together with the oxidizing gas and the inert gas. The oxidizing gas supplied into the process chamber 201 reacts with at least a part of the aluminum-containing layer formed on the wafer 200 in the source gas supply step S111. Then, the aluminum-containing layer serving as the first layer is oxidized to form an aluminum oxide layer (also referred to as an "AlO layer") containing aluminum (Al) and oxygen (O) serving as a metal oxide layer. That is, the aluminum-containing layer is modified into the aluminum oxide layer.

<Residual Gas Removing Step S114>

After the aluminum oxide layer (AlO layer) is formed, the valve 324 is closed to stop the supply of the oxidizing gas. In the residual gas removing step S114, with the APC valve 243 open and the valves 514 and 524 open, the inert gas is continuously supplied into the process chamber 201 (that is, the process chamber 201 is purged), and the inner atmosphere of the process chamber 201 is vacuum-exhausted to remove a residual oxidizing gas in the process chamber 201 which did not react or which contributed to the formation of the aluminum oxide layer or the reaction by-products remaining in the process chamber 201 from the process chamber 201 in the same manner as in the residual gas removing step S112.

<Performing Predetermined Number of Times, Step S115>

By performing the cycle wherein the source gas supply step S111, the residual gas removing step S112, the oxidizing gas supply step S113 and the residual gas removing step S114 are sequentially and non-simultaneously performed in order a predetermined number of times (one or more times), an oxide film containing aluminum as the predetermined element (that is, an aluminum oxide film) is formed on the wafer 200. The predetermined number of times of the cycle is appropriately selected according to a target thickness of the oxide film. However, it is preferable that the cycle is performed a plurality of times. For example, the target thickness of the oxide film may range from 0.1 nm to 150 nm, preferably from 0.1 nm to 10 nm. By setting the target thickness of the oxide film to 150 nm or less, it is possible to reduce a surface roughness of the oxide film. By setting the target thickness of the oxide film to 0.1 nm or more, it is possible to suppress the oxide film from being peeled off due to a stress difference between the oxide film and its underlying film (or a base film).

<After-Purge Step S121 and Returning to Atmospheric Pressure Step S122>

After the film-forming step S110 is completed, the valves 514 and 524 are opened. Thereby, the inert gas is supplied into the process chamber 201 through each of the gas supply pipes 310 and 320, and then the inert gas supplied into the process chamber 201 is exhausted through the exhaust pipe 231. The inert gas serves as the purge gas, and the inner atmosphere of the process chamber 201 is purged with the inert gas. Thus, a residual gas in the process chamber 201 or the reaction by-products remaining in the process chamber 201 are removed from the process chamber 201 (after-purge step S121). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure step S122).

<Boat Unloading Step S123 and Wafer Discharging Step S124>

Thereafter, the seal cap 219 is lowered by the boat elevator 115 and the lower end opening of the manifold 209 is opened. The boat 217 with the processed wafers 200 charged therein is unloaded out of the reaction tube 203 through the lower end opening of the manifold 209 (boat unloading step S123). After the boat 217 is unloaded, the shutter (not shown) is moved. Thereby, the lower end opening of the manifold 209 is sealed by the shutter (not shown) through the O-ring (not shown). Then, the processed wafers 200 are discharged (transferred) from the boat 217 (wafer discharging step S124).

The disclosers of the present application have confirmed that the oxide film is formed on the wafer 200 in a convex shape (that is, a distribution in which a thickness of the oxide film at the center of the wafer 200 is relatively greater than the thickness of the oxide film outside the center of the wafer 200) when a supply time of supplying the oxidizing gas to the wafer 200 in the oxidizing gas supply step S113 described above is short, and by lengthening the supply time of supplying the oxidizing gas to the wafer 200, the oxide film formed on the wafer 200 changes from the convex shape to a concave shape (that is, a distribution in which the thickness of the oxide film at the center of the wafer 200 is relatively smaller than the thickness of the oxide film outside the center of the wafer 200). As a result, the disclosers of the present application have confirmed that, by adjusting the supply time of supplying the oxidizing gas to the wafer 200, it is possible to control a thickness distribution of the oxide film formed on the surface of the wafer 200 provided with the pattern formed on the surface thereof, and it is also possible to improve a uniformity of the thickness of the oxide film on the surface of the wafer 200.

According to the present embodiment, a surface area of a pattern wafer (that is, a wafer provided with the pattern formed on a surface thereof) is greater than that of the bare wafer on which no pattern is formed. Therefore, an amount of the gas such as the oxidizing gas consumed by the pattern wafer is greater than that of the gas consumed by the bare wafer. In addition, since the wafers 200 are accommodated in the process chamber 201 of the substrate processing apparatus 10 in a multistage manner with the predetermined interval therebetween by the boat 217 and the gases are supplied from the outer peripheries of the wafers 200 toward the surfaces of the wafers 200, the oxidizing gas reacts with at least a part of the aluminum-containing layer formed on the wafers 200 in the source gas supply step S111, and this chemical reaction propagates from the outer peripheries of the wafers 200 toward the surfaces of the wafers 200.

When the supply time of supplying the oxidizing gas to the wafer 200 is short, since the oxidizing gas supplied from the outer periphery of the wafer 200 is consumed from the outer periphery of the wafer 200, the center of the wafer 200 may not be sufficiently oxidized by (reacts with) the oxidizing gas. The oxidizing gas reacts with at least a part of the aluminum-containing layer to form an oxide layer (that is, the aluminum oxide layer). However, on the center of the wafer 200 in which an oxidation is insufficient, an excessive adsorption site such as an OH group to which the source gas is adsorbed may be formed on a surface of the oxide layer due to the insufficient oxidation. Therefore, the source gas may be further adsorbed on the center of the wafer 200. As a result, since the thickness of the film at the center of the wafer 200 in which the oxidation is insufficient may be increased than that of the thickness of the film on the outer periphery of the wafer 200, the film is formed on the wafer 200 in the convex shape.

When the supply time of supplying the oxidizing gas to the wafer 200 is lengthened, the oxidation by the oxidizing gas supplied from the outer periphery of the wafer 200 propagates from the outer periphery of the wafer 200 to the center of the wafer 200. Thus, when the oxidizing gas reacts with at least a part of the aluminum-containing layer to form the oxide layer, the oxide film is formed on the center of the wafer 200 in the same manner as on the outer periphery of the wafer 200 without forming the excessive adsorption site such as the OH group, and the thickness of the oxide film is reduced as compared with a case of the insufficient oxidation. In addition, when the oxidation further proceeds and the oxidation in the oxide layer is saturated, a base (interface) of the oxide layer may be oxidized and a volume of the interface may be increased. Thereby, the thickness of the film is supposed to be greater on the outer periphery of the wafer 200, which is oxidized earlier than the center of the wafer 200, and the oxide film may be formed on the wafer 200 such that it changes from the convex shape to the concave shape. The thickness of the film may be particularly likely to increase due to the insufficient oxidation when a gas containing a hydrocarbon group such as an alkyl group, a methyl group and an ethyl group is used as the source gas.

Therefore, the supply time of supplying the oxidizing gas to the wafer 200 is selected such that the thickness distribution of the oxide film becomes a predetermined distribution on the surface of the wafer 200. For example, by lengthening the supply time of the oxidizing gas, it is possible to adjust the thickness distribution of the oxide film on the surface of the wafer 200 from the convex shaped distribution to the concave shaped distribution. Further, by setting the supply time of the oxidizing gas to an appropriate time that is sufficient to change the thickness distribution of the oxide film on the surface of the wafer 200 from the convex shaped distribution to a nearly uniform distribution but is shorter than the above-mentioned supply time during which the thickness distribution of the oxide film on the surface of the wafer 200 changes from the convex shaped distribution to the concave shaped distribution, it is possible to uniformize the thickness distribution of the oxide film on the surface of the wafer 200. Further, by setting the supply time of the oxidizing gas shorter than the supply time during which the thickness distribution of the oxide film on the surface of the wafer 200 changes from the convex shaped distribution to the concave shaped distribution, it is possible to suppress the oxidation of the base (interface) of the oxide layer (oxide film) from propagating from the outer periphery of the wafer 200.

That is, the film-forming process according to the present embodiment is performed by storing data relating to the supply time of the oxidizing gas and the thickness distribution of the oxide film on the surface of the wafer 200 in the memory 121c or the external memory 123 in advance and by appropriately selecting the supply time of the oxidizing gas such that the thickness distribution of the oxide film becomes the predetermined distribution on the surface of the wafer 200.

In other words, the supply time of the oxidizing gas is selected to be longer than a supply time during which the thickness distribution of the oxide film becomes the convex shaped distribution such that the thickness distribution of the oxide film becomes the predetermined distribution on the surface of the wafer 200. In addition, the supply time of the oxidizing gas is selected to be shorter than the supply time during which the thickness distribution of the oxide film becomes the concave shaped distribution on the surface of the wafer 200 such that the thickness distribution of the oxide film becomes the predetermined distribution on the surface of the wafer 200. In addition, the supply time of the oxidizing gas is selected such that the thickness distribution of the oxide film is uniformized on the surface of the wafer 200. Further, the supply time of the oxidizing gas is selected such that the uniformity of the thickness of the oxide film becomes 10% or less on the surface of the wafer 200. According to the present embodiment, for example, the uniformity of the thickness of the oxide film on the surface of the wafer 200 may be calculated by [(a maximum thickness of the film)−(a minimum thickness of the film)]/(average thickness of the film)", that is, a difference between a maximum thickness and a minimum thickness of the film divided by an average thickness of the film.

Further, the supply time of the oxidizing gas is selected based on the pitch between the wafers (that is, the predetermined interval of the wafer 200) such that the thickness distribution of the oxide film becomes the predetermined distribution on the surface of the wafer 200. As the pitch between the wafers becomes narrower, the convex shape of the thickness distribution of the oxide film on the surface of the wafer 200 becomes more evident due to the supply time of the oxidizing gas. Therefore, by lengthening the supply time of the oxidizing gas, it is possible to uniformize the thickness distribution of the oxide film on the surface of the wafer 200. That is, the supply time of the oxidizing gas is selected to be longer as the pitch between the wafers becomes narrower. For example, the pitch between the wafers may range from 3 mm to 50 mm. It is possible to improve the uniformity of the thickness of the oxide film on the surface of the wafer 200 as the pitch between the wafers becomes wider. However, in order to obtain the effect of controlling the thickness distribution of the oxide film on the surface of the wafer 200 by adjusting the supply time of the oxidizing gas, it is preferable to set the pitch between the wafers to 50 mm or less. When the pitch between the wafers is greater than 50 mm, the effect described above may not be sufficiently obtained. When the pitch between the wafers is less than 3 mm, the thickness of the oxide film on the outer periphery of the wafer 200 may be increased before the thickness of the oxide film on the center of the wafer 200 is reduced when adjusting the thickness distribution of the oxide film from the convex shaped distribution to a uniform distribution on the surface of the wafer 200 by lengthening the supply time of the oxidizing gas. Therefore, it is preferable to set the pitch between the wafers to 3 mm or more.

Further, the supply time of the oxidizing gas is selected based on the surface area of the upper surface of the wafer 200 such that the thickness distribution of the oxide film becomes the predetermined distribution on the surface of the wafer 200. As the surface area of the upper surface of the wafer 200 becomes larger, the convex shape of the thickness distribution of the oxide film on the surface of the wafer 200 becomes more evident due to the supply time of the oxidizing gas. Therefore, by lengthening the supply time of the oxidizing gas, it is possible to uniformize the thickness distribution of the oxide film on the surface of the wafer 200. That is, the supply time of the oxidizing gas is selected to be longer as the surface area of the upper surface of the wafer 200 becomes larger.

(3) Effects according to Present Embodiment

According to the present embodiment described above, it is possible to provide one or more of the following effects.

(a) It is possible to control the thickness distribution of the oxide film formed on the surface of the substrate (that is, the wafer 200).

(b) It is possible to improve the uniformity of the thickness of the oxide film formed on the surface of the substrate.

(c) It is possible to improve the throughput by selecting an amount of supply time according to the thickness distribution of the oxide film on the surface of the substrate as the supply time of the oxidizing gas.

(d) By uniformizing the thickness distribution of the oxide film on the surface of the substrate, it is possible to suppress the oxidation of the base (interface) of the oxide film.

Other Embodiments

While the technique of the present disclosure is described in detail by way of the embodiments described above, the above-described technique is not limited thereto. The above-described technique may be modified in various ways without departing from the gist thereof.

For example, the above-described embodiments are described by way of an example in which the TMA gas is used as the source gas containing the predetermined element. However, the above-described technique is not limited thereto. For example, the above-described technique may also be applied when the gas containing the hydrocarbon group such as the alkyl group, the methyl group and the ethyl group is used as the source gas containing the predetermined element.

For example, the above-described embodiments are described by way of an example in which the AlO film containing aluminum is formed as the oxide film containing the predetermined element. However, the above-described technique is not limited thereto. For example, the above-described technique may also be preferably applied when other oxide film such as a silicon oxide (SiO) film, a hafnium oxide (HfO) film, a zirconium oxide (ZrO) film, a titanium oxide (TiO) film, a tantalum oxide (TaO) film, a molybdenum oxide (MoO) film and a tungsten oxide (WO) film is formed as the oxide film containing the predetermined element.

For example, the above-described embodiments are described by way of an example in which the gas is supplied from the outer periphery of the wafer 200 toward the surface (center) of the wafer 200. However, the above-described technique is not limited thereto. For example, the above-described technique may also be preferably applied when the gas is diffused from the outer periphery of the wafer 200 toward the surface (center) of the wafer 200.

For example, recipes used in the substrate processing (film-forming process) are preferably prepared individually according to the process contents and stored in the memory 121c via an electric communication line or the external memory 123. When starting the substrate processing, the CPU 121a is configured to select an appropriate recipe among the recipes stored in the memory 121c according to the process contents. Thus, various films of different composition ratios, qualities and thicknesses may be formed in a reproducible manner by using a single substrate processing apparatus. In addition, since the burden on an operator of the substrate processing apparatus may be reduced, various processes may be performed quickly while avoiding a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. The existing recipe already stored in the substrate processing apparatus may be directly changed to a new recipe by operating the input/output device 122 of the substrate processing apparatus.

The processing sequences and the processing conditions of the modified examples described above may be substantially the same as those of the above-described embodiments. According to the modified examples described above, it is possible to obtain substantially the same effects according to the embodiment described above.

EXAMPLE OF EMBODIMENTS

Figure 4:
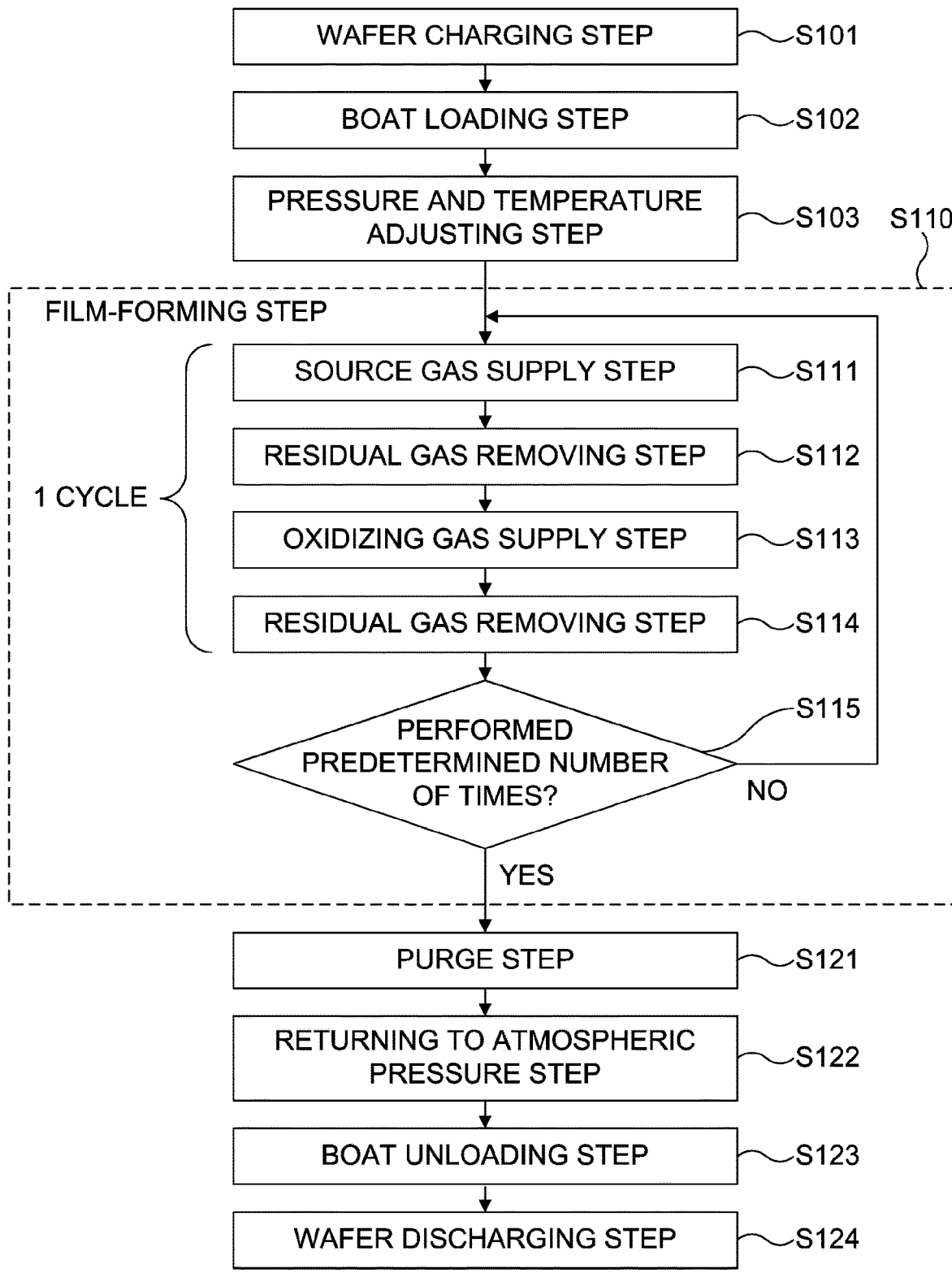
FIG. 4 is a flow chart schematically illustrating an exemplary flow of a film-forming process according to the embodiments described herein.

In an example of the embodiments, the substrate processing apparatus 10 shown in FIG. 1 is used to place a monitor wafer 300 in the boat 217 between a first wafer and a second wafer among the wafers 200 as shown in FIG. 5. The wafers 200 are placed in the boat 217 such that first surfaces thereof on which the pattern is formed face the bottom. Then, the supply time of the oxidizing gas in the oxidizing gas supply step S113 of the sequence shown in FIG. 4 is controlled to evaluate the thickness distribution of the oxide film formed on an upper surface 300A and a lower surface 300B of the monitor wafer 300. The surface area of the first surface of the wafer 200 on which the pattern is formed in advance is 50 times as large as the surface area of the surface of the bare wafer. Then, the thickness distributions of the oxide film formed on the upper surface 300A and the lower surface 300B of the monitor wafer 300 are evaluated under the assumption that: (i) the thickness of the oxide film formed on the upper surface 300A (hereinafter, also referred to as a "pattern surface 300A") of the monitor wafer 300 facing the first surface of the first wafer on which the pattern is formed is equivalent to the thickness of the oxide film formed on the first surface of the wafer 200 on which the pattern is formed in advance; and (ii) the thickness of the oxide film formed on the lower surface 300B (hereinafter, also referred to as a "bare surface 300B") of the monitor wafer 300 facing a second surface of the second wafer on which no pattern is formed is equivalent to the thickness of the oxide film formed on the surface of the bare wafer on which no pattern is formed.

First, relationships among the surface area of the wafer 200, the pitch between the wafers, the supply time of the oxidizing gas and the thickness distribution of the oxide film on the surface of the wafer 200 are evaluated. In the present example, for example, the TMA gas is used as the source gas and the $O_3$ gas) is used as the oxidizing gas.

Figure 6A:
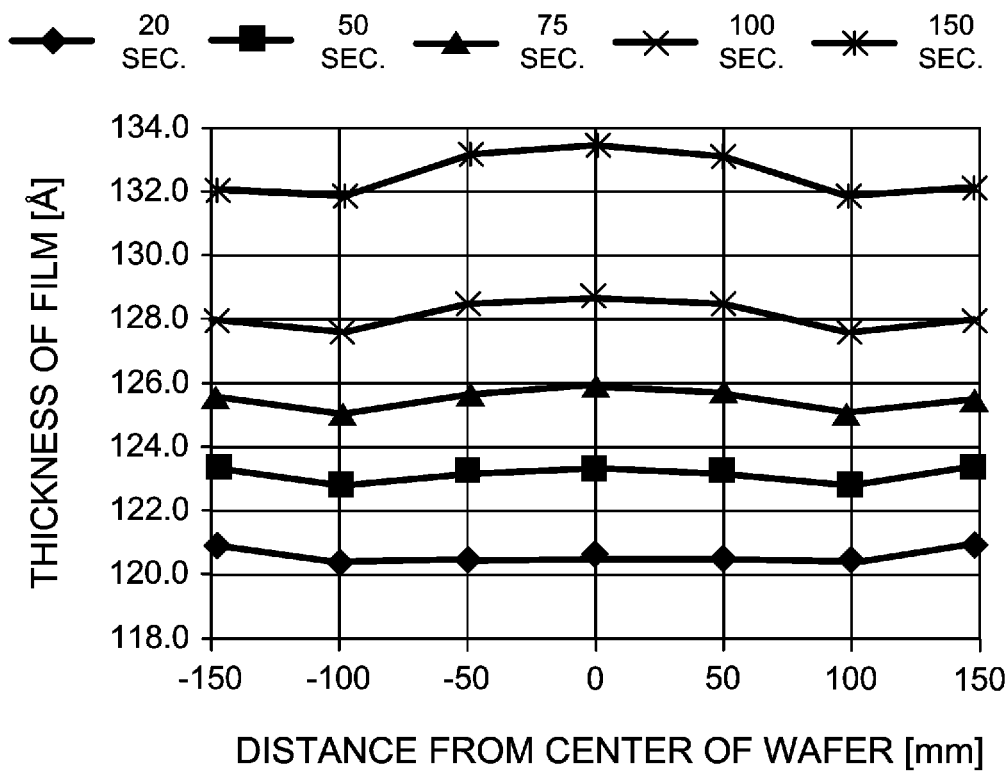
FIG. 6A is a diagram schematically illustrating a relationship between a supply time of an oxidizing gas and a thickness distribution of an oxide film formed on a bare surface when a pitch between substrates is equal to a first distance.
Figure 6B:
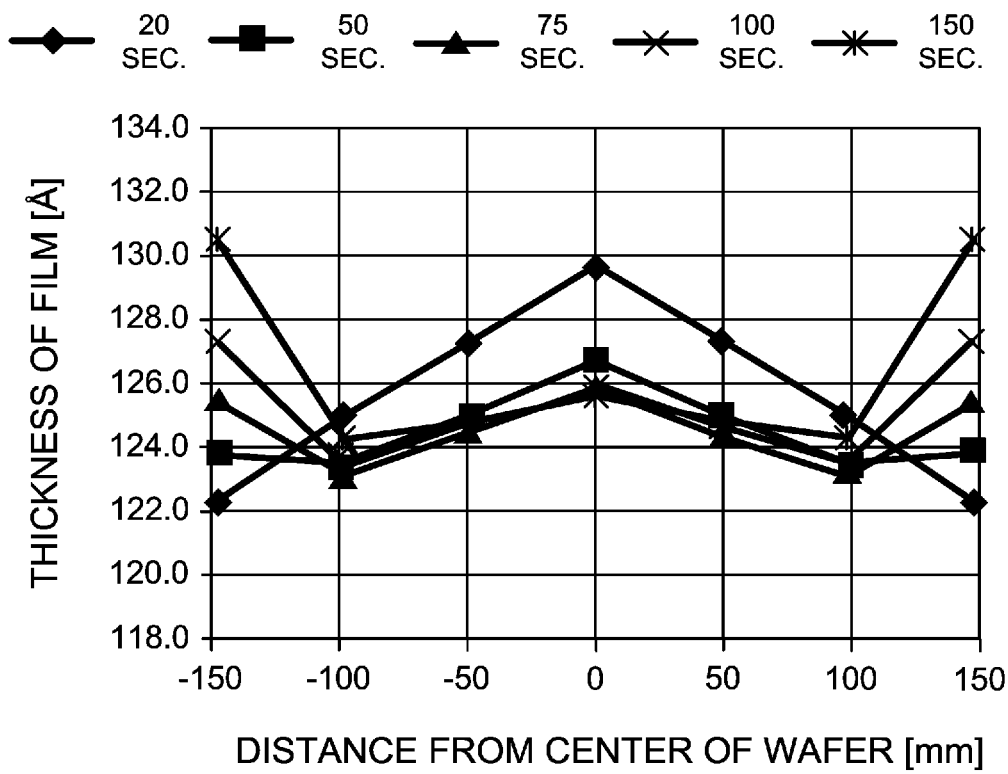
FIG. 6B is a diagram schematically illustrating a relationship between the supply time of the oxidizing gas and a thickness distribution of the oxide film formed on a pattern surface when the pitch between the substrates is equal to the first distance.
Figure 7A:
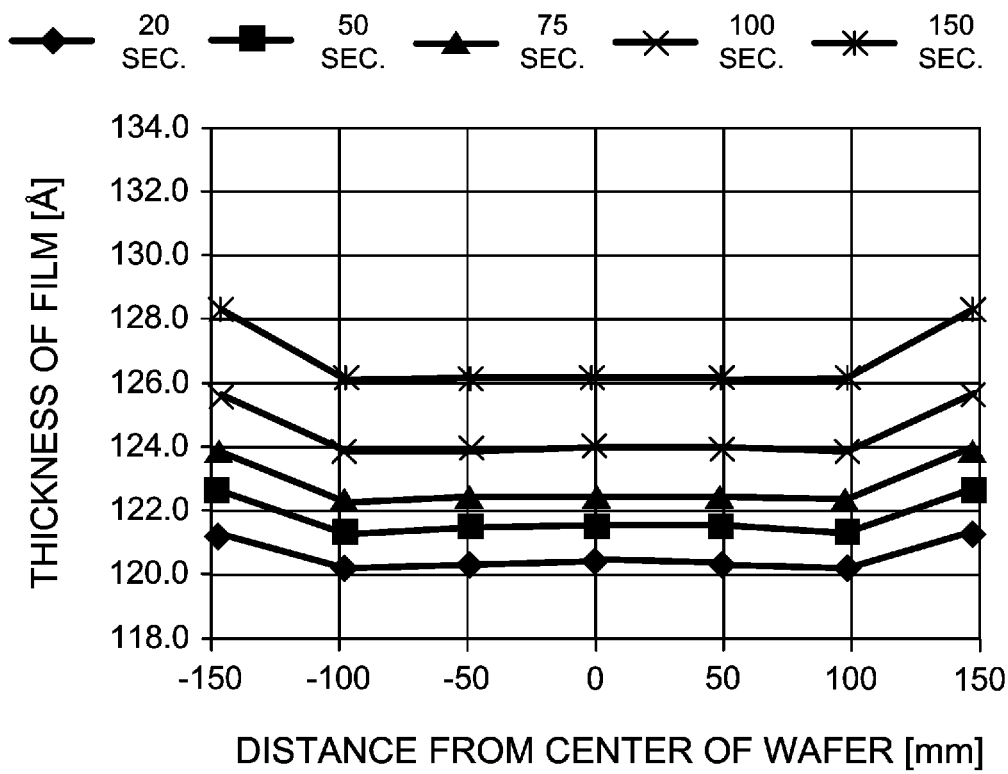
FIG. 7A is a diagram schematically illustrating a relationship between the supply time of the oxidizing gas and the thickness distribution of the oxide film formed on the bare surface when the pitch between the substrates is equal to a second distance.

FIG. 6A is a diagram schematically illustrating a relationship between the supply time of the oxidizing gas and the thickness distribution of the oxide film formed on the bare surface 300B when the pitch "P" between the wafers is equal to a first distance (16 mm), and FIG. 6B is a diagram schematically illustrating a relationship between the supply time of the oxidizing gas and the thickness distribution of the oxide film formed on the pattern surface 300A when the pitch P between the wafers is equal to the first distance. FIG. 7A is a diagram schematically illustrating a relationship between the supply time of the oxidizing gas and the thickness distribution of the oxide film formed on the bare surface 300B when the pitch P between the wafers is equal to a second distance (8 mm), and FIG. 7B is a diagram schematically illustrating a relationship between the supply time of the oxidizing gas and the thickness distribution of the oxide film formed on the pattern surface 300A when the pitch P between the wafers is equal to the second distance.

As shown in FIGS. 6A and 7A, the thickness distribution of the oxide film formed on the bare surface 300B is substantially uniformized on the bare surface 300B. In addition, when the supply time of the oxidizing gas is lengthened, the thickness of the oxide film is increased with the thickness distribution of the oxide film on the bare surface 300B being substantially uniform.

On the other hand, as shown in FIG. 6B, when the pitch P between the wafers is equal to the first distance, the thickness distribution of the oxide film on the pattern surface 300A becomes the convex shaped distribution in which the oxide film formed on the center of the pattern surface 300A is convex when the supply time of the oxidizing gas is 20 seconds, and the thickness distribution of the oxide film on the pattern surface 300A becomes a nearly uniform distribution in which the thickness of the oxide film on the center of the pattern surface 300A is reduced when the supply time of the oxidizing gas is 50 seconds. When the supply time of the oxidizing gas is further lengthened, the thickness of the oxide film formed on an outer periphery of the monitor wafer 300 is increased such that the thickness distribution of the oxide film on the pattern surface 300A becomes the concave shaped distribution.

Figure 7B:
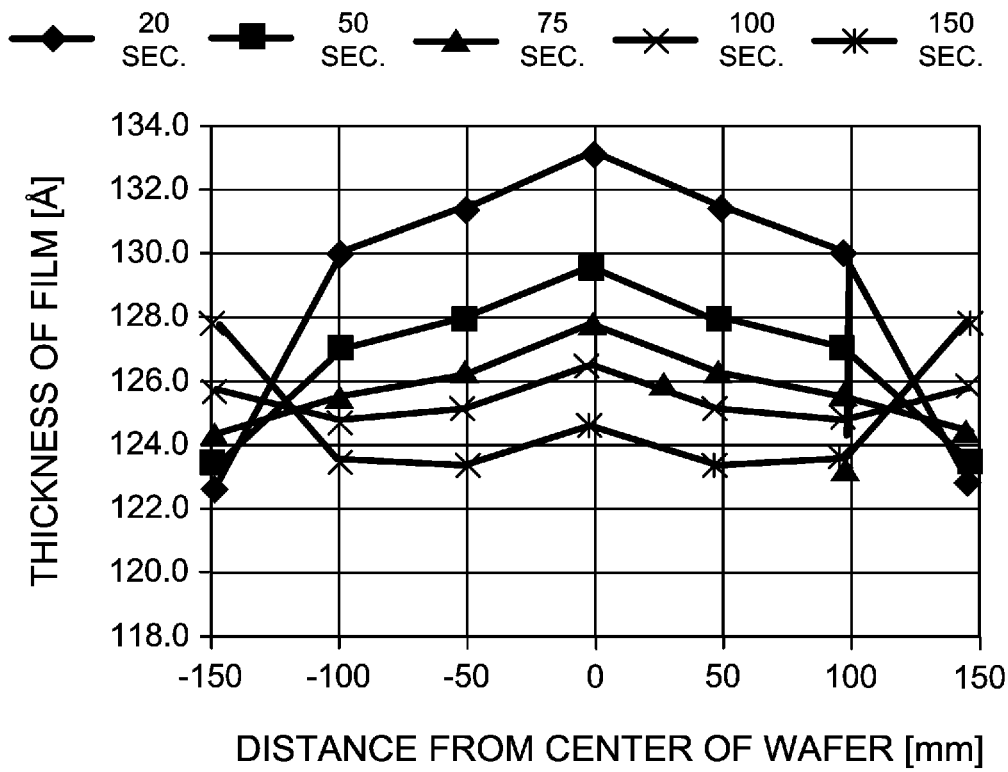
FIG. 7B is a diagram schematically illustrating a relationship between the supply time of the oxidizing gas and the thickness distribution of the oxide film formed on the pattern surface when the pitch between the substrates is equal to the second distance.

As shown in FIG. 7B, when the pitch P between the wafers is equal to the second distance, the thickness distribution of the oxide film on the pattern surface 300A becomes the convex shaped distribution when the supply time of the oxidizing gas is 20 seconds. The thickness of the oxide film on the center of the pattern surface 300A is reduced when the supply time of the oxidizing gas is 50 seconds. The thickness distribution of the oxide film on the pattern surface 300A becomes a nearly uniform distribution in which the thickness of the oxide film on the center of the pattern surface 300A is further reduced when the supply time of the oxidizing gas is 100 seconds. When the supply time of the oxidizing gas is further lengthened, the thickness of the oxide film formed on an outer periphery of the monitor wafer 300 is increased such that the thickness distribution of the oxide film on the pattern surface 300A becomes the concave shaped distribution.

That is, it is confirmed that the thickness distribution of the oxide film formed on the wafer 200 may change depending on the surface area of the upper surface of the wafer 200 and the pitch between the wafers. Further, it is also confirmed that, as the surface area of the upper surface of the wafer 200 becomes larger, the thickness distribution of the oxide film changes from the convex shaped distribution to the nearly uniform distribution by lengthening the supply time of the oxidizing gas, and that the thickness distribution of the oxide film changes to the concave shaped distribution by further lengthening the supply time of the oxidizing gas. Further, it is also confirmed that, as the pitch between the wafers is narrower, the thickness distribution of the oxide film changes from the convex shaped distribution to the nearly uniform distribution by lengthening the supply time of the oxidizing gas, and that the thickness distribution of the oxide film changes to the concave shaped distribution by further lengthening the supply time of the oxidizing gas.

Figure 8:
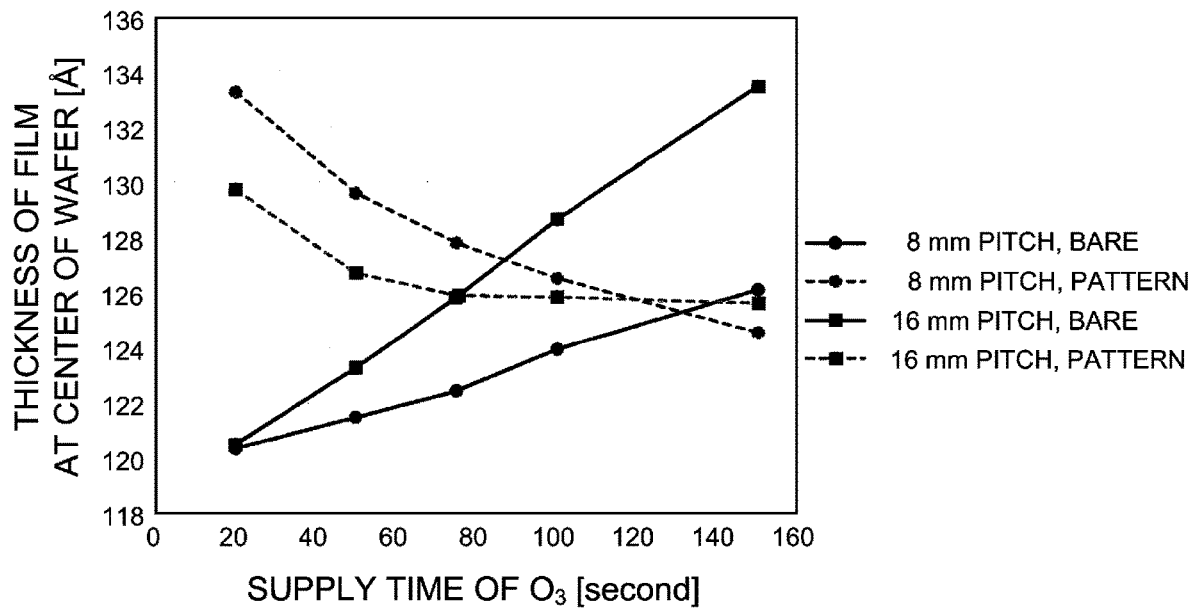
FIG. 8 is a diagram schematically illustrating relationships among a thickness of the oxide film formed on a center of the bare surface, a thickness of the oxide film formed on a center of the pattern surface, the supply time of the oxidizing gas and the pitch between the substrates.

Subsequently, the change in the thickness of the oxide film at each center of the bare surface 300B and the pattern surface 300A when the pitch P between the wafers is equal to the second distance are compared with the change in the thickness of the oxide film at each center of the bare surface 300B and the pattern surface 300A when the pitch P between the wafers is equal to the first distance. FIG. 8 is a diagram schematically illustrating relationships among the thickness of the oxide film formed on the center of the bare surface 300B, the thickness of the oxide film formed on the center of the pattern surface 300A, the supply time of the oxidizing gas and the pitch P between the wafers.

As shown in FIG. 8, it is confirmed that the thickness of the oxide film on the center of the bare surface 300B is increased by lengthening the supply time of the oxidizing gas regardless of whether the pitch P between the wafers is equal to the first distance or the second distance. Further, the thickness of the oxide film is less increased when the pitch P between the wafers is narrow (that is, when the pitch P between the wafers is equal to the second distance) as compared with a case when the pitch P between the wafers is equal to the first distance On the other hand, it is confirmed that the thickness of the oxide film on the center of the pattern surface 300A is reduced by lengthening the supply time of the oxidizing gas regardless of whether the pitch P between the wafers is equal to the first distance or the second distance. Further, the thickness of the oxide film on the center of the pattern surface 300A when the pitch P between the wafers is equal to the second distance is greater than the thickness of the oxide film on the center of the pattern surface 300A when the pitch P between the wafers is equal to the first distance. However, when the supply time of the oxidizing gas is further lengthened to about 150 seconds, the thickness of the oxide film on the center of the pattern surface 300A when the pitch P between the wafers is wide (that is, when the pitch P between the wafers is equal to the first distance) is greater than the thickness of the oxide film on the center of the pattern surface 300A when the pitch P between the wafers is equal to the second distance. That is, it is confirmed that the wider the pitch P between the wafers, the thicker the oxide film due to the propagation of the oxidation.

That is, it is confirmed that the center of the wafer 200 on which the pattern is formed becomes convex due to the insufficient oxidation, and that the thickness of the oxide film on the center of the wafer 200 is reduced when the oxidation propagates by lengthening the supply time of the oxidizing gas. It is also confirmed that the thickness of the oxide film on the center of the wafer 200 is increased when the oxidation propagates by further lengthening the supply time of the oxidizing gas.

Figure 9:
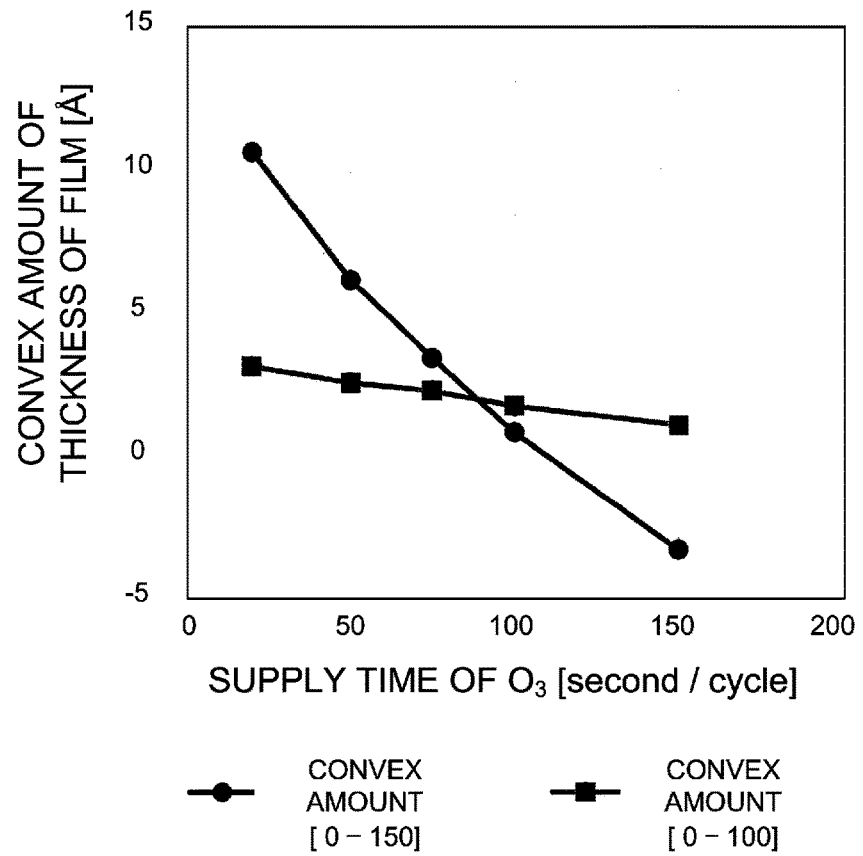
FIG. 9 is a diagram schematically illustrating relationships among a convex amount of the thickness of the oxide film from a center of the substrate to a position 150 mm away from the center of the substrate, a convex amount of the thickness of the oxide film from the center of the substrate to a position 100 mm away from the center of the substrate and the supply time of the oxidizing gas.

Subsequently, a relationship between a convex amount of the thickness of the oxide film from the center of the wafer 200 to a position 150 mm away from the center of the wafer 200 (that is, the end portion of the wafer 200) and the supply time of the oxidizing gas is compared with a relationship between a convex amount of the thickness of the oxide film from the center of the wafer 200 to a position 100 mm away from the center of the wafer 200 and the supply time of the oxidizing gas. FIG. 9 is a diagram schematically illustrating the relationships among the convex amount of the thickness of the oxide film from the center of the wafer 200 to the position 150 mm away from the center of the wafer 200, the convex amount of the thickness of the oxide film from the center of the wafer 200 to the position 100 mm away from the center of the wafer 200 and the supply time of the oxidizing gas.

As shown in FIG. 9, the convex amount of the thickness of the oxide film from the center of the wafer 200 to the end portion of the wafer 200 (which is a difference in the thickness of the oxide film from the center to the end portion of the wafer 200) is about 11 Å when the supply time of the oxidizing gas is 20 seconds. When the supply time of the oxidizing gas is lengthened, the convex amount of the thickness of the oxide film from the center of the wafer 200 to the end portion of the wafer 200 becomes smaller. The convex amount of the thickness of the oxide film from the center of the wafer 200 to the end portion of the wafer 200 becomes zero (0) when the supply time of the oxidizing gas is 100 seconds. When the supply time of the oxidizing gas is 150 seconds, the convex amount of the thickness of the oxide film from the center of the wafer 200 to the end portion of the wafer 200 is about −3 Å.

The convex amount of the thickness of the oxide film from the center of the wafer 200 to the position 100 mm away from the center of the wafer 200 is about 3 Å when the supply time of the oxidizing gas is 20 seconds. When the supply time of the oxidizing gas is lengthened, the convex amount of the thickness of the oxide film from the center of the wafer 200 to the position 100 mm away from the center of the wafer 200 becomes smaller. When the supply time of the oxidizing gas is 150 seconds, the convex amount of the thickness of the oxide film from the center of the wafer 200 to the position 100 mm away from the center of the wafer 200 is about 1 Å.

That is, it is confirmed that the thickness distribution of the oxide film changes from the convex shaped distribution to the concave shaped distribution by lengthening the supply time of the oxidizing gas.

As described above, according to some embodiments in the present disclosure, it is possible to control the thickness distribution of the film on the surface of the substrate when the film is formed on the surface of the substrate provided with the pattern formed thereon.

What is claimed is:
1. A substrate processing method, comprising
forming an oxide film containing a predetermined element on a surface of a substrate wherein the surface is provided with a pattern formed thereon by performing a cycle a predetermined number of times, the cycle comprising:

(a) forming a first layer containing the predetermined element on the surface of the substrate by supplying a source gas containing the predetermined element to the substrate from an outer periphery of the substrate toward the surface of the substrate; and (b) forming an oxide layer containing the predetermined element on the surface of the substrate by supplying an oxidizing gas to the substrate from the outer periphery of the substrate toward the surface of the substrate to oxidize the first layer, wherein (a) and (b) are performed non-simultaneously, and a supply time of supplying the oxidizing gas to the substrate in (b) is selected such that a thickness distribution of the oxide film becomes a predetermined distribution on the surface of the substrate by selecting the supply time to be a first time if the predetermined distribution is a convex shaped distribution and selecting the supply time to be a second time greater than the first time if the predetermined distribution is a concave shaped distribution.

2. The method of claim 1, wherein the supply time of supplying the oxidizing gas to the substrate in (b) is selected such that the thickness distribution of the oxide film on the surface of the substrate is adjusted from the convex shaped distribution to the concave shaped distribution.

3. The method of claim 1, wherein the supply time of supplying the oxidizing gas to the substrate in (b) is selected to be longer than a supply time during which the thickness distribution of the oxide film becomes the convex shaped distribution on the surface of the substrate.

4. The method of claim 3, wherein the supply time of supplying the oxidizing gas to the substrate in (b) is selected such that the thickness distribution of the oxide film becomes uniform or the concave shaped distribution on the surface of the substrate.

5. The method of claim 1, wherein the supply time of supplying the oxidizing gas to the substrate in (b) is selected such that the thickness distribution of the oxide film is uniformized on the surface of the substrate.

6. The method of claim 5, wherein the supply time of supplying the oxidizing gas to the substrate in (b) is selected such that a uniformity of a thickness of the oxide film on the surface of the substrate is equal to or less than a predetermined value.

7. The method of claim 1, wherein the supply time of supplying the oxidizing gas to the substrate in (b) is selected to be shorter than a supply time during which the thickness distribution of the oxide film becomes the concave shaped distribution on the surface of the substrate.

8. The method of claim 1, wherein the oxidizing gas is supplied in (b) from the outer periphery of the substrate toward a center of the substrate.

9. The method of claim 8, wherein the oxidizing gas is supplied in (b) from a supply port facing the outer periphery of the substrate toward the center of the substrate.

10. The method of claim 8, wherein the oxidizing gas is diffused in (b) from the outer periphery of the substrate toward the center of the substrate.

11. The method of claim 1, wherein a plurality of substrates comprising the substrate are arranged in a multistage manner with a predetermined interval therebetween.

12. The method of claim 11, wherein the supply time of supplying the oxidizing gas to the substrate in (b) is selected based on the predetermined interval such that the thickness distribution of the oxide film becomes the predetermined distribution on the surface of the substrate.

13. The method of claim 11, wherein the supply time of supplying the oxidizing gas to the substrate in (b) is selected to be longer as the predetermined interval becomes narrower.

14. The method of claim 1, wherein the supply time of supplying the oxidizing gas to the substrate in (b) is selected based on a surface area of an upper surface of the substrate such that the thickness distribution of the oxide film becomes the predetermined distribution on the surface of the substrate.

15. The method of claim 14, wherein the supply time of the oxidizing gas is selected to be longer as the surface area of the upper surface of the substrate becomes larger.

16. The method of claim 1, wherein the supply time of supplying the oxidizing gas to the substrate in (b) is selected such that a uniformity of a thickness of the oxide film on the surface of the substrate calculated by [(a maximum thickness of the oxide film)−(a minimum thickness of the oxide film)]/(an average thickness of the oxide film) is 10% or less.

17. A method of manufacturing a semiconductor device, comprising the method of claim 1.

18. A substrate processing apparatus, comprising:
a process chamber;
a source gas supplier configured to supply a source gas containing a predetermined element to a substrate with a pattern formed on a surface thereof in the process chamber from an outer periphery of the substrate toward the surface of the substrate;
an oxidizing gas supplier configured to supply an oxidizing gas to the substrate from the outer periphery of the substrate toward the surface of the substrate; and
a controller configured to be capable of controlling the source gas supplier and the oxidizing gas supplier to form an oxide film containing the predetermined element on the surface of the substrate by performing a cycle a predetermined number of times, the cycle comprising:
(a) forming a first layer containing the predetermined element on the surface of the substrate by supplying the source gas to the substrate; and
(b) forming an oxide layer containing the predetermined element on the surface of the substrate by supplying the oxidizing gas to the substrate to oxidize the first layer,
wherein (a) and (b) are performed non-simultaneously, and the controller is further configured to be capable of selecting a supply time of supplying the oxidizing gas to the substrate in (b) such that a thickness distribution of the oxide film becomes a predetermined distribution on the surface of the substrate by selecting the supply time to be a first time if the predetermined distribution is a convex shaped distribution and selecting the supply time to be a second time greater than the first time if the predetermined distribution is a concave shaped distribution.

19. A non-transitory computer-readable recording medium storing a program that causes, by a computer, a substrate processing apparatus to perform:
forming an oxide film containing a predetermined element on a surface of a substrate wherein the surface is provided with a pattern formed thereon by performing a cycle a predetermined number of times, the cycle comprising:
(a) forming a first layer containing the predetermined element on the surface of the substrate in a process chamber of the substrate processing apparatus by supplying a source gas containing the predetermined element to the substrate from an outer periphery of the substrate toward the surface of the substrate; and (b) forming an oxide layer containing the predetermined element on the surface of the substrate by supplying an oxidizing gas to the substrate from the outer periphery of the substrate toward the surface of the substrate to oxidize the first layer, wherein (a) and (b) are performed non-simultaneously, and a supply time of supplying the oxidizing gas to the substrate is selected in (b) such that a thickness distribution of the oxide film becomes a predetermined distribution on the surface of the substrate by selecting the supply time to be a first time if the predetermined distribution is a convex shaped distribution and selecting the supply time to be a second time greater than the first time if the predetermined distribution is a concave shaped distribution.

* * * * *